United States Patent [19]
Yano

[11] Patent Number: 5,299,167
[45] Date of Patent: Mar. 29, 1994

[54] BIPOLAR RAM APPARATUS
[75] Inventor: Motoyasu Yano, Kanagawa, Japan
[73] Assignee: Sony Corporation, Japan
[21] Appl. No.: 5,126
[22] Filed: Jan. 15, 1993
[30] Foreign Application Priority Data
  Jan. 23, 1992 [JP] Japan .................. 4-034401
[51] Int. Cl.$^5$ ............................. G11C 11/40
[52] U.S. Cl. .................. 365/204; 365/177; 365/230.06
[58] Field of Search .............. 365/177, 204, 230.06
[56] References Cited
  U.S. PATENT DOCUMENTS 4,156,941  5/1979  Homma et al. ............ 365/204 X
  4,366,558 12/1982  Homma et al. ............ 365/204
  4,393,476  7/1983  Ong ....................... 365/204 X
  4,611,303  9/1986  Kitano .................... 365/204 X
  4,618,944 10/1986  Okajima .................. 365/204 X
  4,821,234  4/1989  Nakase ................... 365/230.06

OTHER PUBLICATIONS

IEEE Journal of Solid-State Circuits, vol. SC-18, No. 5, Oct. 1983, A High Speed 16 kbit ECL RAM.

*Primary Examiner*—Eugene R. LaRoche
*Assistant Examiner*—Son Dinh
*Attorney, Agent, or Firm*—Ronald P. Kananen

[57]  ABSTRACT

A bipolar RAM apparatus comprises a memory cell array where a plurality of memory cells are connected in parallel between a pair of word lines arranged in N rows decoders are provided for the individual rows of the memory cell array respectively and each serves to select the corresponding row of the memory cells. N drive transistors are for driving, when turned on, the rows of the memory cells individually in response to the respective drive outputs of the decoders. N discharge circuits comprise discharge transistors whose emitters are mutually connected in common between the circuits and whose collectors are connected respectively to the word lines in the individual rows. Coupling capacitors apply the inverted signals of the drive outputs at a nonselected time to the bases of the discharge transistors and resistors apply a fixed bias voltage to the bases of the discharge transistors. A constant current source is connected between the emitter common node of the discharge transistors and a reference potential point. There occurs no noise margin reduction, and the necessity of widening the word line is eliminated. Fast transition to a nonselected state is achievable, and the power consumption can be minimized.

3 Claims, 5 Drawing Sheets

BIPOLAR RAM APPARATUS

BACKGROUND OF THE INVENTION

1. Field of the Invention

The present invention relates to a bipolar RAM (random access memory) apparatus and, more particularly, to a discharge circuit used in a bipolar RAM apparatus for executing fast transition of selected memory cells to a nonselected state.

2. Description of the Prior Art

In a bipolar RAM apparatus, it has been customary heretofore to employ such a circuit configuration as shown in FIG. 1. More specifically, in discharge circuits $2_1$-$2_N$ provided in individual rows of a memory cell array 1, negative logic outputs $Y_{N1}$-$Y_{NN}$ of decoders $3_1$-$3_N$ are used as driving outputs, which are then delayed by means of delay circuits $4_1$-$4_N$ consisting of resistors $R_{a1}$-$R_{aN}$, $R_{b1}$-$R_{bN}$ and capacitors $C_{a1}$-$C_{aN}$. The outputs thus delayed are applied to the bases of discharge transistors $Q_{c1}$-$Q_{cN}$ respectively to thereby discharge the memory cells for transition of the same to a nonselected state.

However, in such conventional circuit configuration, a total discharge current Idis comes to flow in the drive transistor $Q_b$ of the selected word line, so that the base-emitter voltage $V_{BE}$ of the transistor $Q_b$ is rendered great to consequently raise a disadvantage of reduction in the noise margin.

Furthermore, as obvious from FIG. 2, a great current Idis required merely during the discharge time is kept flowing steadily to eventually bring about an increased current consumption. Moreover, due to the concentrative flow of such great current Idis in one word line, it becomes necessary to widen the word line against electron migration, hence raising another problem of an increase in both the memory cell area and the wiring capacitance.

OBJECTS AND SUMMARY OF THE INVENTION

It is an object of the present invention to provide an improved bipolar RAM apparatus where no reduction of the noise margin is ensured with elimination of the necessity of widening the word line, and fast transition of memory cells to a nonselected state can be achieved with another advantage of lower power consumption.

According to one aspect of the present invention, there is provided a bipolar RAM apparatus which comprises a memory cell array where a plurality of memory cells connected in parallel between a pair of word lines are arranged in N rows; N decoders provided for the individual rows of the memory cell array respectively and each serving to select the corresponding row of the memory cells; N drive transistors for driving, when turned on, the rows of the memory cells individually in response to the respective drive outputs of the decoders at a selected time; N discharge circuits comprising discharge transistors whose emitters are mutually connected in common between the circuits and whose collectors are connected respectively to the word lines in the individual rows, coupling capacitors for applying the inverted signals of the drive outputs at a nonselected time to the bases of the discharge transistors, and resistors for applying a fixed bias voltage to the bases of the discharge transistors; and a constant current source connected between the emitter common node of the discharge transistors and a reference potential point.

According to another aspect of the present invention, there is provided a bipolar RAM apparatus wherein a discharge capacitor is connected to the emitter common node of the aforesaid discharge transistors.

According to a further aspect of the present invention, there is provided a bipolar RAM apparatus wherein the aforesaid constant current source is provided for each of the N discharge circuits individually, and the parasitic capacitances of such constant current sources are used as the discharge capacitor.

In the discharge circuits disposed for the individual rows of the memory cell array respectively, a fixed bias voltage is applied via resistors to the bases of the discharge transistors and, at the time of transition from a selected state to a nonselected state, the inverted signals of the drive outputs from the decoders are applied via coupling capacitors to the bases of the discharge transistors. Then, except the discharge duration, the discharge current comes to flow dispersively in the entire word lines. However, during the discharge action, the discharge current flows momentarily to consequently prevent reduction of the noise margin while eliminating the necessity of widening the word lines.

Furthermore, due to connection of the capacitor to the emitter common node of the discharge transistors, one discharge transistor, when turned on, drives the connected capacitor during the discharge action, so that a sufficient current several times greater than the prepared discharge current comes to flow momentarily to thereby execute a short-time discharge action, hence realizing fast transition to a nonselected state with minimized power consumption.

The above and other features and advantages of the present invention will become apparent from the following description which will be given with reference to the illustrative accompanying drawings.

DESCRIPTION OF THE PREFERRED EMBODIMENT

Hereinafter a preferred embodiment of the present invention will be described in detail with reference to the accompanying drawings.

Figure 1:
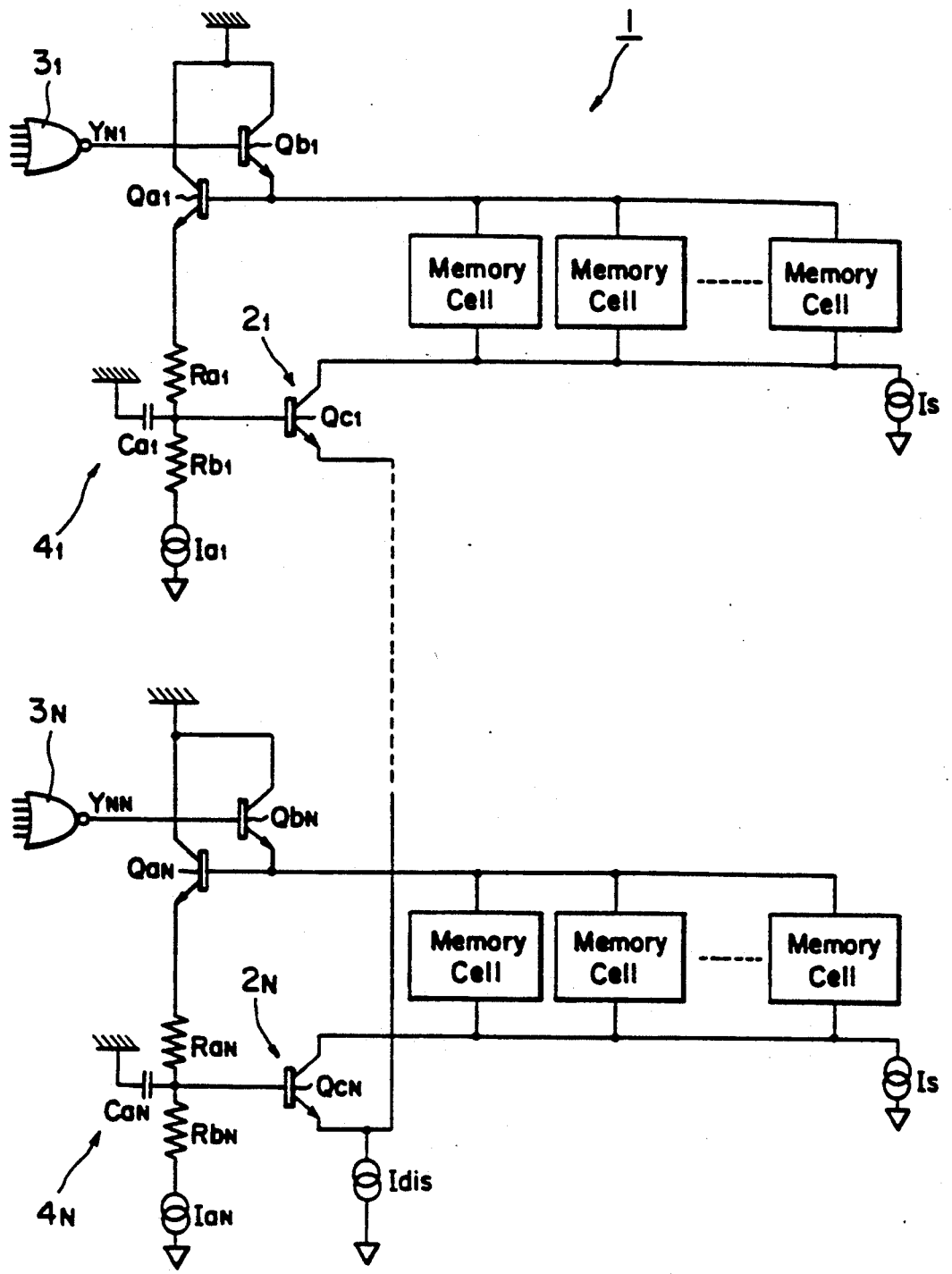
FIG. 1 is a circuit diagram of an exemplary conventional apparatus.
Figure 2:
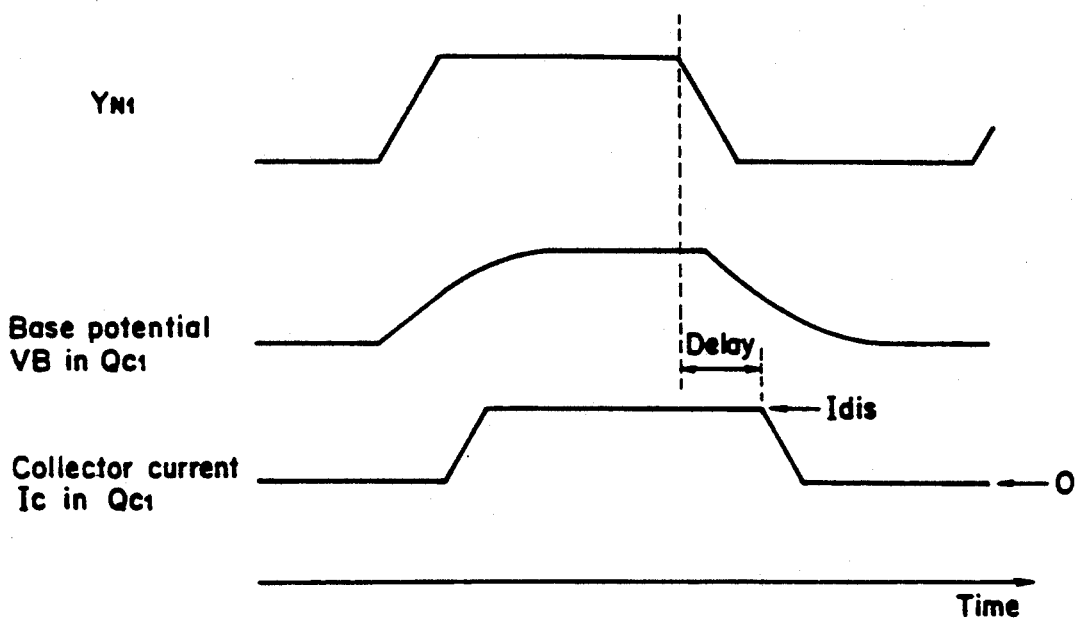
FIG. 2 is a waveform chart of signals for explaining the circuit operation in the conventional apparatus of FIG. 1.
Figure 3:
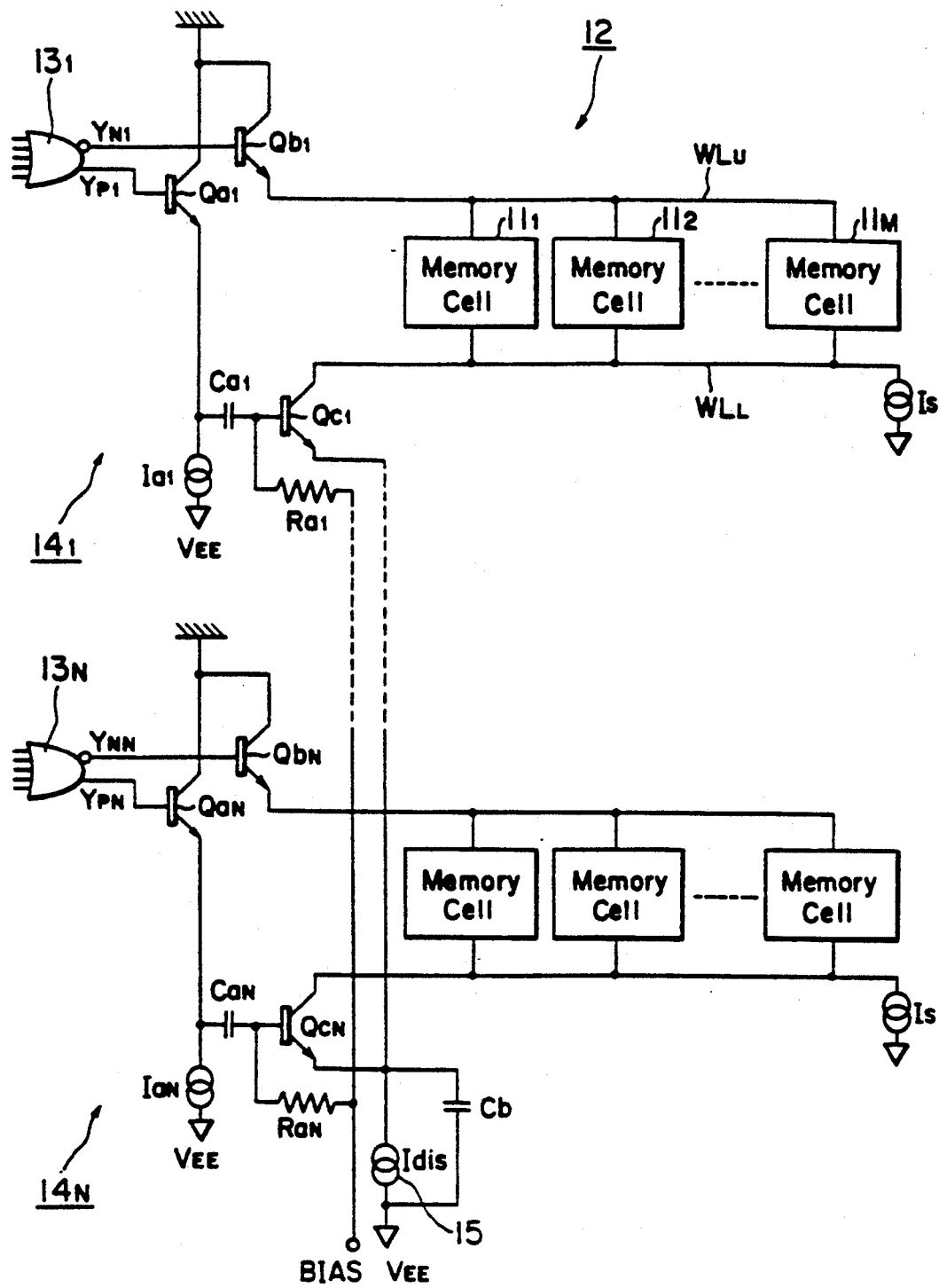
FIGS. 3(A) and 3(B) are circuit diagrams of preferred embodiments representing the bipolar RAM apparatus of the present invention.
Figure 3:
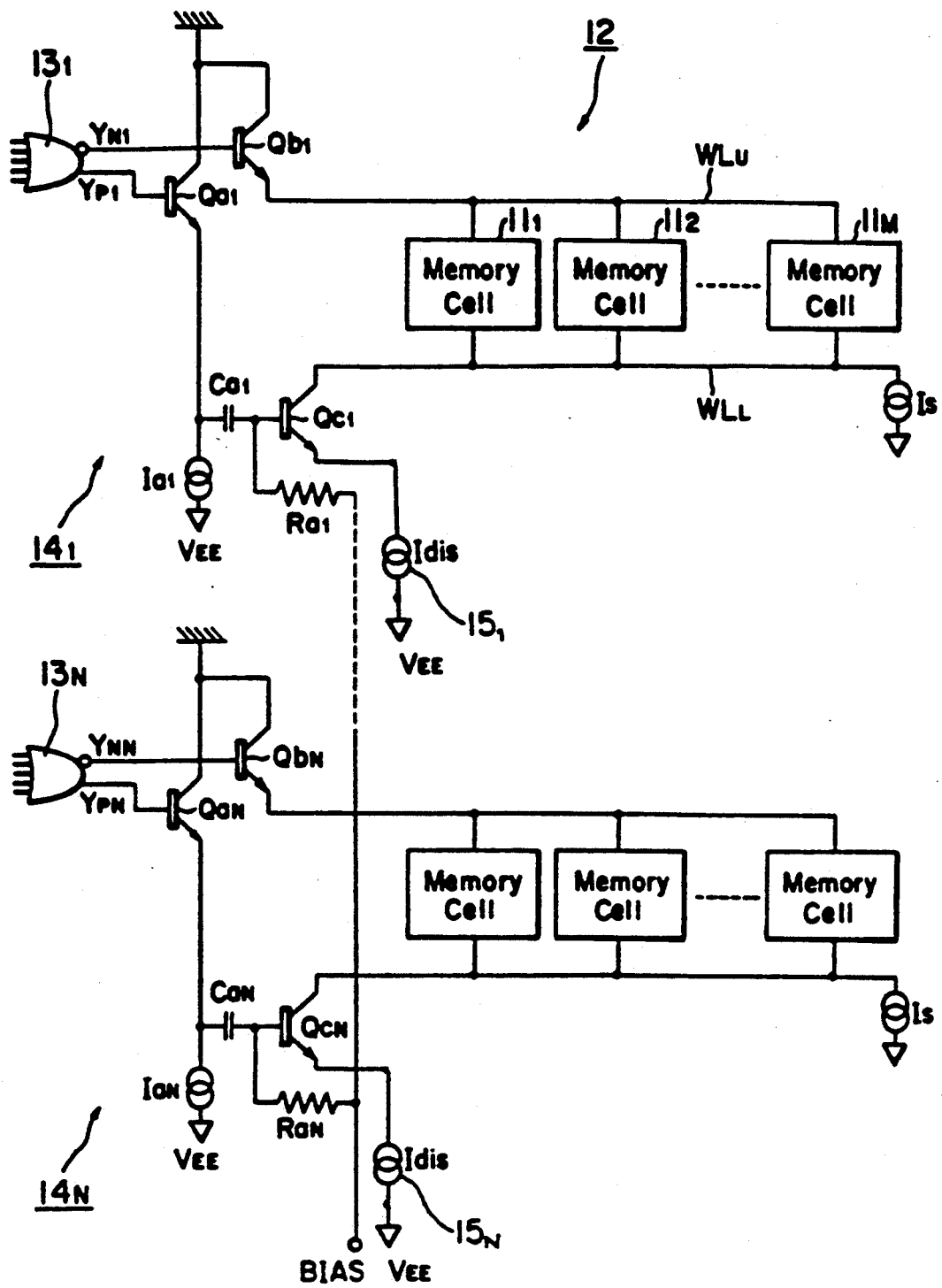

FIG. 3(A) is a circuit diagram showing the constitution of an exemplary embodiment which represents the bipolar RAM apparatus of the present invention. In the diagram, M pieces (M columns) of memory cells $11_1$-$11_M$ are connected in parallel between a pair of an upper word line $W_{LU}$ and a lower word line $W_{LL}$, and such memory cells are arranged in N rows to constitute a memory cell array 12. Decoders $13_1$-$13_N$ are provided for the individual rows of such memory array 12.

Each of the decoders $13_1$-$13_N$ consists of a NOR gate of, e.g., an ECL (emitter coupled logic) circuit configuration. Due to the use of such ECL circuit configuration for the decoders $13_1$-$13_N$, it is rendered possible to simply deliver both the negative logic outputs $Y_{N1}$-$Y_{NN}$ which are drive outputs of the memory cells and the positive logic outputs $Y_{P1}$-$Y_{PN}$ which are inverted signals of the positive logic outputs.

Drive transistors $Q_{b1}$-$Q_{bN}$ are provided for the individual rows of the memory array 12 under such condition that the collectors are grounded and the emitters are connected to the upper word lines $W_{LU}$. The drive transistors $Q_{b1}$-$Q_{bN}$ receive, at the bases thereof, the negative logic outputs $Y_{N1}$-$Y_{NN}$ of the decoders $13_1$-$13_N$ and serve to drive the memory cells $11_1$-$11_M$ in the corresponding rows respectively in response to the negative logic outputs $Y_{N1}$-$Y_{NN}$.

Discharge circuits $14_1$-$14_N$ are provided for the individual rows of the memory cell array 12 so a to execute fast transition of the memory cells $11_1$-$11_M$ from a selected state to a nonselected state. Since the circuit configuration is exactly the same with respect to each of the discharge circuits $14_1$-$14_N$, the configuration of merely one discharge circuit $14_1$ will be described in detail below as a representative example.

In the discharge circuit $14_1$, a level shift transistor $Q_{a1}$ and a constant current source $I_{a1}$ are connected in series between a ground GND and a negative power source $V_{EE}$, and the positive logic output $Y_{P1}$ of the decoder $13_1$ is supplied to the base of the level shift transistor $Q_{a1}$. The emitter output of the level shift transistor $Q_{a1}$ is supplied via a capacitor $C_{a1}$ to the base of a discharge transistor $Q_{c1}$ whose collector is connected to the lower word line $W_{LL}$.

A fixed bias voltage is applied via a resistor $R_{a1}$ to the base of the discharge transistor $Q_{c1}$, whose emitter is connected in common to the respective emitters of the discharge transistors $Q_{c2}$-$Q_{cN}$ in the other discharge circuits $14_2$-$14_N$, and a constant current source 15 for a discharge current Idis is connected between the emitter common node and the negative power source $V_{EE}$ (reference potential). A capacitor $C_b$ having a capacitance value Cdis sufficient to store required electric charge for a discharge is connected to the constant current source 15.

Now the circuit operation at the time of selection of the first-row memory cells in the above configuration will be described below with reference to the waveform chart of FIG. 4. In this chart, there are shown the respective waveforms of the negative logic output $Y_{N1}$ and the positive logic output $Y_{P1}$ of the decoder $13_1$, the base potential VB of the discharge transistor $Q_{c1}$, and the current $I_c$ flowing in the discharge transistor $Q_{c1}$.

First, in a steady state where no change occurs in the negative logic output $Y_{N1}$ and the positive logic output $Y_{P1}$ of the decoder $13_1$, a fixed bias voltage is applied via the resistors $R_{a1}$-$R_{aN}$ to the bases of the discharge transistors $Q_{c1}$-$Q_{cN}$ in the discharge circuits $14_1$-$14_N$, so that the discharge current Idis flows dispersively in the discharge transistors $Q_{c1}$-$Q_{cN}$. Accordingly, in the memory cell array consisting of N rows, the current flowing in each of the discharge transistors $Q_{c1}$-$Q_{cN}$ is Idis/N in the steady state.

Figure 4:
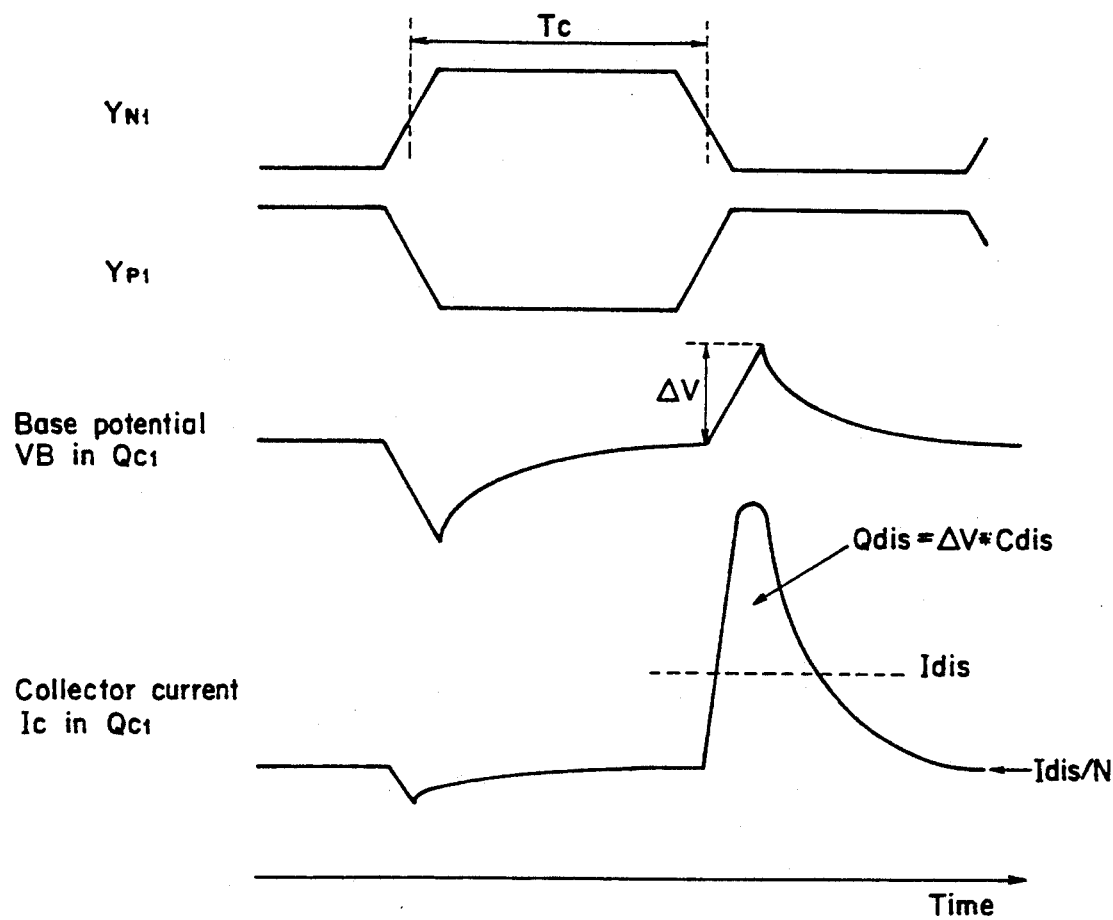
FIG. 4 is a waveform chart of signals for explaining the circuit operation in the apparatus of the present invention shown in FIG. 3(A).

At the transition from a selected state to a nonselected state, i.e., when a discharge current is required, the negative logic output $Y_{N1}$ of the decoder $13_1$ falls while the positive logic output $Y_{P1}$ thereof rises, so that the positive logic output $Y_{P1}$ is applied, after a level shift by the transistor $Q_{a1}$, via the capacitor $C_{a1}$ to the base of the discharge transistor $Q_{c1}$, whereby the base potential VB thereof is shaped into a differential waveform which rises by $\Delta V$ as shown in FIG. 4.

Since the discharge transistor $Q_{c1}$ is turned on completely by the base voltage VB of such differential waveform, the total discharge current Idis comes to flow in the discharge transistor $Q_{c1}$. Thereafter the discharge current Idis is kept flowing in the discharge transistor $Q_{c1}$ until the base potential VB resumes its steady-state level with the time constant determined by the respective values of the resistor $R_{a1}$ and the capacitor $C_{a1}$.

More specifically, in the steady state, the discharge current Idis flows dispersively in the discharge transistors $Q_{c1}$-$Q_{cN}$ of the discharge circuits $14_1$-$14_N$. Only during the discharge at the nonselected time will the current Idis flows concentratively in one discharge transistor $Q_{c1}$ alone. Consequently it becomes possible to solve the known problems of noise margin reduction and electron migration that are caused by a concentrative flow of the discharge current Idis in the conventional discharge circuit configuration at the time of selection.

Due to the constitution where the capacitor $C_b$ having a great capacitance Cdis sufficient to store required electric charge for discharge is connected to the emitter common node of the respective discharge transistors $Q_{c1}$-$Q_{cN}$ in the discharge circuits $14_1$-$14_N$, the discharge transistor $Q_{c1}$ drives the capacitor $C_b$ when turned on, so that a current $I_c$ several times greater than the constant current Idis from the constant current source 15 is caused to flow momentarily in the discharge transistor $Q_{c1}$ to consequently perform a desired discharge action in a short time.

In this stage of the operation, the total charge flowing in the discharge transistor $Q_{c1}$ is expressed as $$Qdis = \Delta V \times Cdis$$

where $\Delta V$ is the signal amplitude at the base of the discharge transistor $Q_{c1}$. Therefore the capacitance Cdis of the capacitor $C_b$ can be set on the basis of the amount of the electric charge required for the desired discharge.

Practically, the capacitance Cdis of the capacitor $C_b$ becomes a considerably great value of several picofarads or so. For this reason, the above example of employing the single capacitor $C_b$ of a great capacitance Cdis may be so modified that a plurality of capacitors $C_b$ are employed dispersively, in the decoders $13_1$-$13_N$ or, as shown in FIG. 3(B) a plurality of constant current sources $15_1$-$15_N$ provided dispersively for the decoders $13_1$-$13_N$ and the parasitic capacitances thereof are used as the capacitor $C_b$.

In such modification, the electric charge Qdis stored in the capacitor $C_b$ may be discharged during the cycle time $T_c$. Accordingly, $$T_c Idis = Qdis$$

From the above, therefore, $$Idis = Qdis/T_c = (\Delta V \times Cdis)/T_c$$

Thus, it is obvious that the discharge current Idis need not be so great.

Also differing from the above embodiment where each of the drive transistor $Q_b$ and the discharge transistor $Q_c$ is composed of a single transistor, it may be replaced with Darlington-connected transistors to further enhance the performance.

In addition, the constant current sources $I_{a1}-I_{aN}$ connected to the emitters of the level shift transistors $Q_{a1}-Q_{aN}$ are necessary only at the fall of the positive logic output $Y_{P1}$ of the decoders $13_1-13_N$. Therefore, the current can be saved through selective switchover by the use of the negative logic output $Y_{N1}$.

As described hereinabove, according to the bipolar RAM apparatus of the present invention where discharge circuits are provided for the individual rows of the memory cell array respectively, a fixed bias voltage is applied via resistors to the bases of the discharge transistors and, at the time of transition from a selected state to a nonselected state, the inverted signals of the drive outputs from the decoders are applied via coupling capacitors to the bases of the discharge transistors. Then, except the discharge duration, the discharge current comes to flow dispersively in the entire word lines. However, during the discharge action, the discharge current flows momentarily in one transistor alone to consequently prevent reduction of the noise margin while eliminating the necessity of widening the word line.

Furthermore, due to connection of the capacitor to the emitter common node of the discharge transistors, one discharge transistor, when turned on, drives the connected capacitor during the discharge action, so that a sufficient current several times greater than the prepared discharge current comes to flow momentarily to thereby execute a short-time discharge action, hence achieving advantageous effects of minimizing the power consumption and realizing fast transition of the memory cells to a nonselected state.

What is claimed is:

1. A bipolar RAM apparatus comprising:
    a memory cell array where a plurality of memory cells connected in parallel between a pair of word lines are arranged in N rows;
    N decoders provided for the individual rows of said memory cell array respectively and each serving to select the corresponding row of said memory cells;
    N drive transistors for driving, when turned on, the rows of said memory cells individually in response to respective drive outputs of said decoders;
    N discharge circuits comprising discharge transistors whose emitters are mutually connected in common between the circuits and whose collectors are connected respectively to the word lines in the individual rows, coupling capacitors for applying inverted signals of the drive outputs at a nonselected time to the bases of said discharge transistors, and resistors for applying a fixed bias voltage to the bases of said discharge transistors; and
    a constant current source connected between the emitter common node of said discharge transistors and a reference potential point.

2. The bipolar RAM apparatus according to claim 1, wherein a discharge capacitor is connected to the emitter common node of said discharge transistors.

3. The bipolar RAM apparatus according to claim 2, wherein said constant current source includes a plurality of constant current sources respectively provided for said N discharge circuits, and parasitic capacitances of such plurality of constant current sources are used as said discharge capacitor.

* * * * *